(12) United States Patent
Sato et al.

(10) Patent No.: US 6,721,915 B2
(45) Date of Patent: Apr. 13, 2004

(54) MEMORY TESTING METHOD

(75) Inventors: Satoshi Sato, Yokohama (JP); Takeshi Furukawa, Yokohama (JP); Akiko Matsumoto, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 438 days.

(21) Appl. No.: 09/750,098

(22) Filed: Dec. 29, 2000

(65) Prior Publication Data

US 2002/0003731 A1 Jan. 10, 2002

(30) Foreign Application Priority Data

May 24, 2000 (JP) ...................................... 2000-152968

(51) Int. Cl.$^7$ ............................................... G06F 11/00
(52) U.S. Cl. ..................... 714/743; 714/718; 365/201; 365/230.01
(58) Field of Search .......................... 714/743, 42, 718, 714/730; 395/185.07; 711/3; 365/218, 230.01, 201

(56) References Cited

U.S. PATENT DOCUMENTS

| | | | |
|---|---|---|---|
| 5,457,658 A | * 10/1995 | Niijima et al. ............... | 365/218 |
| 5,477,494 A | 12/1995 | Miyagawa et al. | |
| 5,699,509 A | * 12/1997 | Gary et al. ............. | 395/185.07 |
| 5,758,056 A | * 5/1998 | Barr ............................... | 711/3 |
| 6,108,745 A | * 8/2000 | Gupta et al. ................... | 711/3 |
| 6,134,677 A | * 10/2000 | Lindsay ....................... | 714/42 |
| 6,202,180 B1 | * 3/2001 | Nose ........................... | 714/718 |

FOREIGN PATENT DOCUMENTS

| | | | |
|---|---|---|---|
| EP | 0 977 121 A2 | * 2/2000 | ........... G06F/12/02 |
| JP | A-60-246100 | 12/1985 | |
| JP | A-5-159598 | 6/1993 | |
| JP | A-7-191099 | 7/1995 | |

* cited by examiner

Primary Examiner—Albert Decady
Assistant Examiner—Dipakkumar Gandhi
(74) Attorney, Agent, or Firm—Arent Fox PLLC

(57) ABSTRACT

In the case where the internal configuration is different in each memory (in the case where the correspondence information between the program address designated by the testing program and the physical address in the memory is different), the correspondence information of each memory is input from externally to the memory testing program, so that it becomes possible to use versatilely the memory testing program. Furthermore, even in the case where the internal configuration is unclear, it becomes possible to presume the internal configuration, so that it becomes possible to use versatilely the memory testing program for various memories.

12 Claims, 9 Drawing Sheets

FIG. 4A
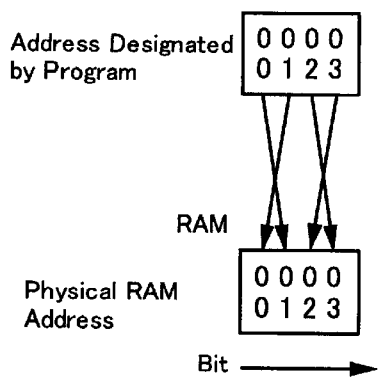
Address Designated by Program: 0 0 0 0 / 0 1 2 3
RAM
Physical RAM Address: 0 0 0 0 / 0 1 2 3
Bit →
FIG. 4B
P00 -> R01
P01 -> R00
P02 -> R03
P03 -> R02
Pxx : Program Address Bit Position
Rxx : Physical RAM Address Bit Position
FIG. 4C
1:0000 -> 0000       8:1000 -> 0100
2:0001 -> 0010       9:1001 -> 0110
3:0010 -> 0001      10:1010 -> 0101
4:0011 -> 0011      11:1011 -> 0111
5:0100 -> 1000      12:1100 -> 1100
6:0101 -> 1010      13:1101 -> 1110
7:0110 -> 1001      14:1110 -> 1101
8:0111 -> 1011      15:1111 -> 1111
FIG. 5A
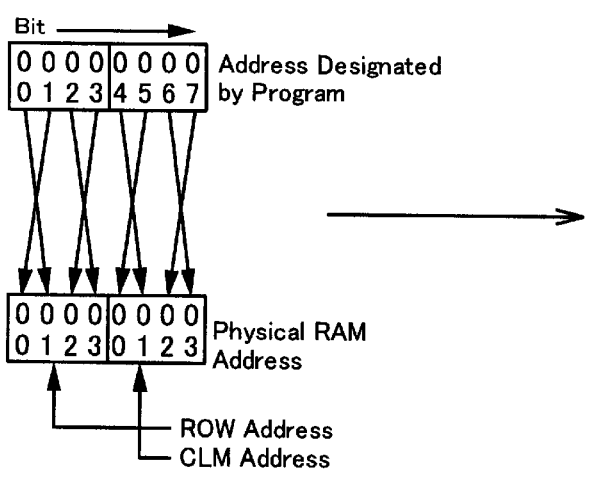
FIG. 5B
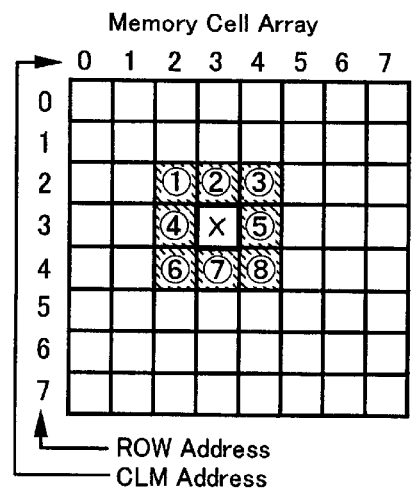

Pxx : Program Address Bit Position
Rxx : Physical RAM Address Bit Position

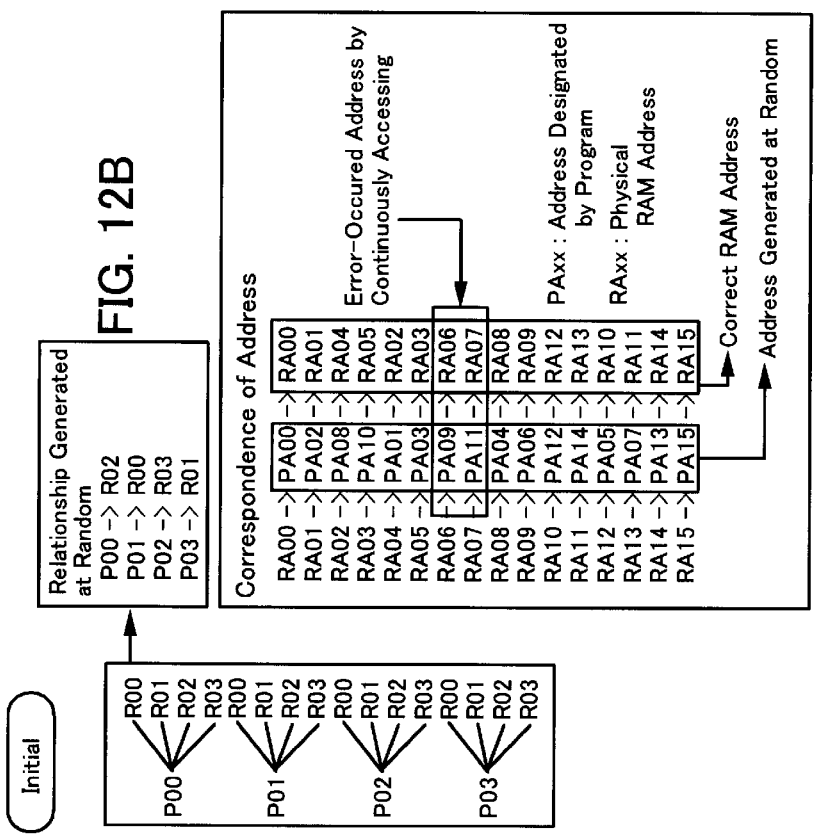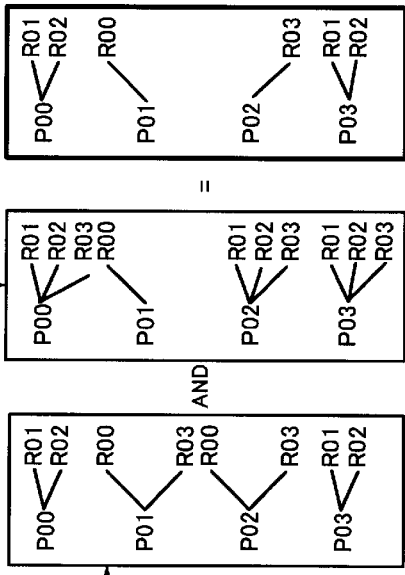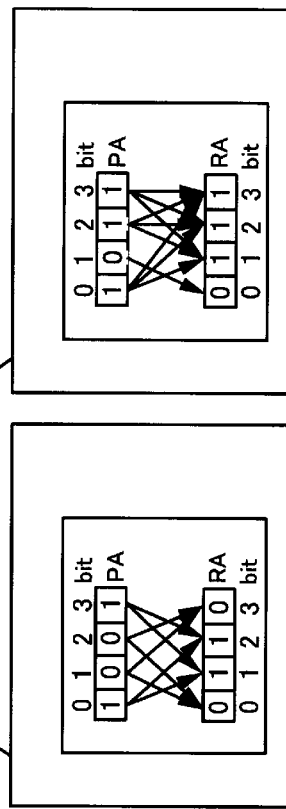

FIG. 13A
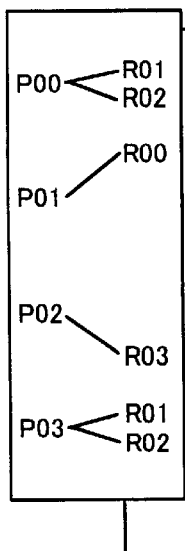
FIG. 13B
Relating Generated at Random
P00 -> R01
P01 -> R00
P02 -> R03
P03 -> R02
Correspondence of Address
RA00 -> PA00 -> RA00
RA01 -> PA02 -> RA01
RA02 -> PA01 -> RA02
RA03 -> PA03 -> RA03
RA04 -> PA08 -> RA04
RA05 -> PA10 -> RA05
RA06 -> PA09 -> RA06
RA07 -> PA11 -> RA07
RA08 -> PA04 -> RA08
RA09 -> PA06 -> RA09
RA10 -> PA05 -> RA10
RA11 -> PA07 -> RA11
RA12 -> PA12 -> RA12
RA13 -> PA14 -> RA13
RA14 -> PA13 -> RA14
RA15 -> PA15 -> RA15
PAxx : Address Designated by Program
RAxx : Physical RAM Address
→ Correct RAM Address
→ Address Generated at Random
FIG. 13C
(1) PA02(0b0010) -> RA01(0b0001)
(2) PA01(0b0001) -> RA02(0b0010)
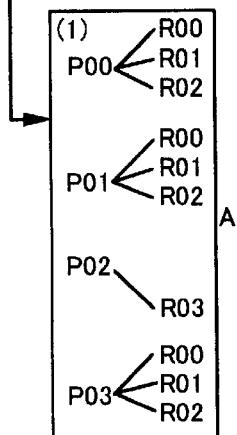 AND 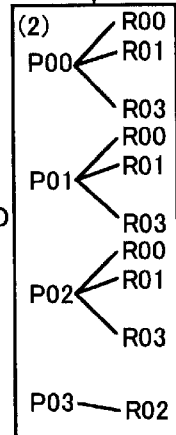 AND 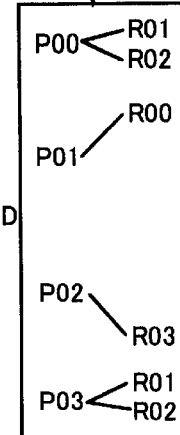 = 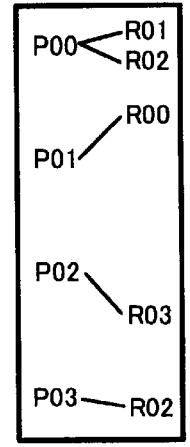
FIG. 13D  FIG. 13E  FIG. 13F
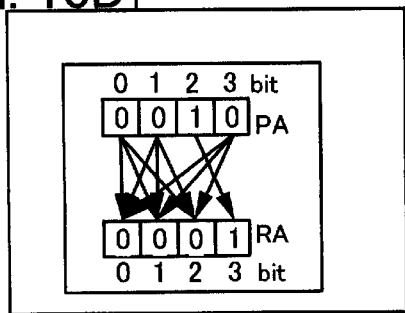 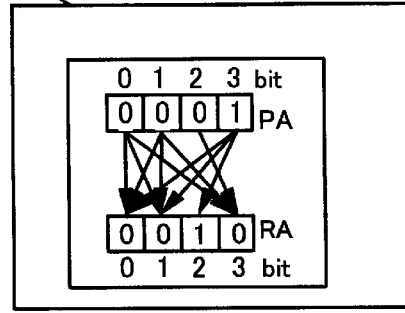

MEMORY TESTING METHOD

BACKGROUND OF THE INVENTION

1. Field of the Invention

The present invention relates to a memory testing method for detecting a bit error of a memory (RAM, ROM).

2. Description of the Related Arts

In a conventional memory testing method, in order to detect an error, for example, read/write tests, etc. on the entire area of the memory are effected. However, in recent years, in such the conventional memory testing method, an undetactable error occurs. A contrivance for noises countermeasure or performance enhancement is incorporated into the memory as hardware, and then a configuration of the memory is complicated, so that the error peculiar to various memories occurs. For the reason, if a memory testing program is not executed making conscious the configuration of the interior of the memory, it is impossible to detect the error peculiar to the memory. For this reason, when the memory testing program is executed, detailed information in the internal configuration of the memory (address allocation) is necessitated.

However, the internal configuration of the memory differs in each manufacturer, and further in the most case, even the memory of the same type of the same manufacturer is different in the internal configuration according to the number of versions. For this reason, when the memory testing program is prepared so as to adapt for a certain memory, the internal configuration differs for the other memories. Therefore, the testing program could not be used, and it was necessary that the testing program is prepared from the beginning for the other memories.

In this manner, the conventional memory testing program was inefficient as it was necessary that the internal configuration is prepared in each same memory. Namely, as it was necessary that another testing program is prepared from the beginning with respect to the memory having a different internal configuration, there was a problem that the number of processes of developing a testing program is enormous.

SUMMARY OF THE INVENTION

It is an object of the present invention to provide a memory testing method according to a versatile testing program not depending upon an internal configuration of a memory.

In order to achieve the above object, according to a first aspect of the present invention there is provided a memory testing method for detecting an error of a memory by executing a testing program accessing the memory, comprising the steps of:

inputting correspondence information between each of a plurality of physical addresses in the memory and a program address designated by the testing program for accessing the respective physical addresses, from externally to the testing program; and designating the program address so as to access at least the one physical address of the memory in accordance with the correspondence information.

According to this memory testing method, it becomes possible to use versatilely the testing program with respect to a plurality of memories which are different respectively in correspondence information.

In order to achieve the above object, according to a second aspect of the present invention there is provided a memory testing method for detecting an error of a memory by executing a testing program accessing the memory to write data therein, comprising the steps of:

inputting correspondence information between first data of at least 1 bit to be written into the memory and second data of at least 1 bit to be designated by the testing program for writing the first data into the memory, from externally to the testing program; and designating the second data so as to write the first data into the memory in accordance with the correspondence information.

Thus, in the case where data specified by the testing program are different from data written into the memory in each memory, it is possible to use versatilely the testing program with respect to the plurality of memories.

In order to achieve the above object, according to a third aspect of the present invention there is provided a memory testing method for detecting an error of a memory by executing a testing program accessing the memory, comprising the steps of:

measuring an access speed to the memory or a value corresponding thereto by a plurality of program addresses which are designated by the testing program for accessing the physical addresses of the memory and have a plurality of bit values different from each other; and acquiring a data format of the program address based on the access speed or the value corresponding thereto.

Thus, in the case where a data format of a program address for designating a physical address of the memory is unclear, it becomes possible to presume the data format. the data format of the program address includes a bit corresponding to each identifier of a row address and column address constituting the physical address of the memory, a bank, each memory of a plurality of memories and each memory controller for controlling the plurality of memories of a plurality of memory controllers.

In order to achieve the above object, according to a fourth aspect of the present invention there is provided a memory testing method for detecting an error of a memory by executing a testing program accessing the memory, comprising the steps of:

selecting arbitrary one of all combinations of correspondence information between each of the plurality of physical addresses in the memory and a program address designated by the testing program for accessing each of the physical addresses;

continuously accessing the plurality of physical addresses based on the selected combination of correspondence information; and in the case where a first error is detected in the step of accessing, abstracting at least one combination in which the plurality of physical addresses detected the first error are adjacent to each other from the all combinations of the correspondence information.

Thus, it becomes possible to presume correspondence information between the physical address of the memory and a program address specified by the testing program.

In the case of a plurality of the abstracted combinations of the correspondence information, arbitrary combination is further selected from the abstracted combinations of the correspondence information, and the plurality of physical addresses are continuously accessed based on the selected combination of correspondence information. In the case where a second error is detected, it is further abstracted at least one combination in which the plurality of physical addresses detected the second error are adjacent to each other from the abstracted combinations of the correspondence information.

By repeating this process, the correspondence information can be specified.

BRIEF DESCRIPTION OF THE DRAWINGS

FIG. 4 are diagrams for explaining a memory testing method according to an embodiment of the present invention;

FIG. 5 are diagrams for explaining a memory test according to the embodiment of the present invention in a two-dimensional matrix;

FIG. 12 are diagrams in detail for explaining a method for searching the address correspondence information; and FIG. 13 are diagrams in detail for explaining a method for searching the address correspondence information.

DESCRIPTION OF THE PREFERRED EMBODIMENTS

Hereinafter, an embodiment of the present invention will be explained. However, the technical scope of the present invention is not limited to this embodiment.

Figure 1B:
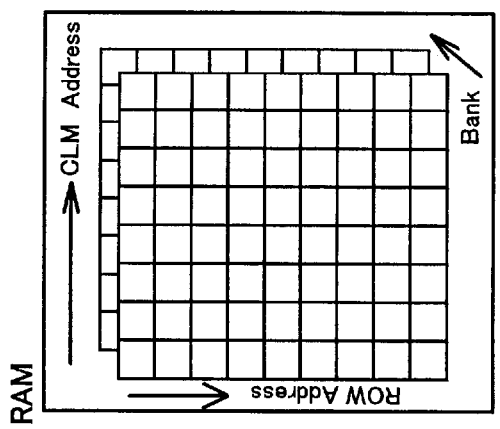
FIG. 1 are diagrams explaining a example of a computer system including a memory tested by a testing program of the present invention.
Figure 1C:
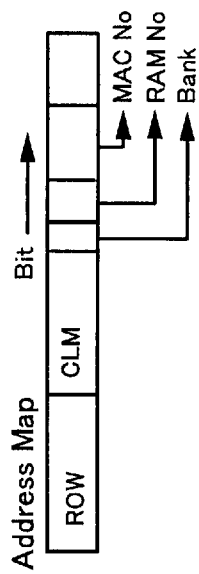
Figure 1A:
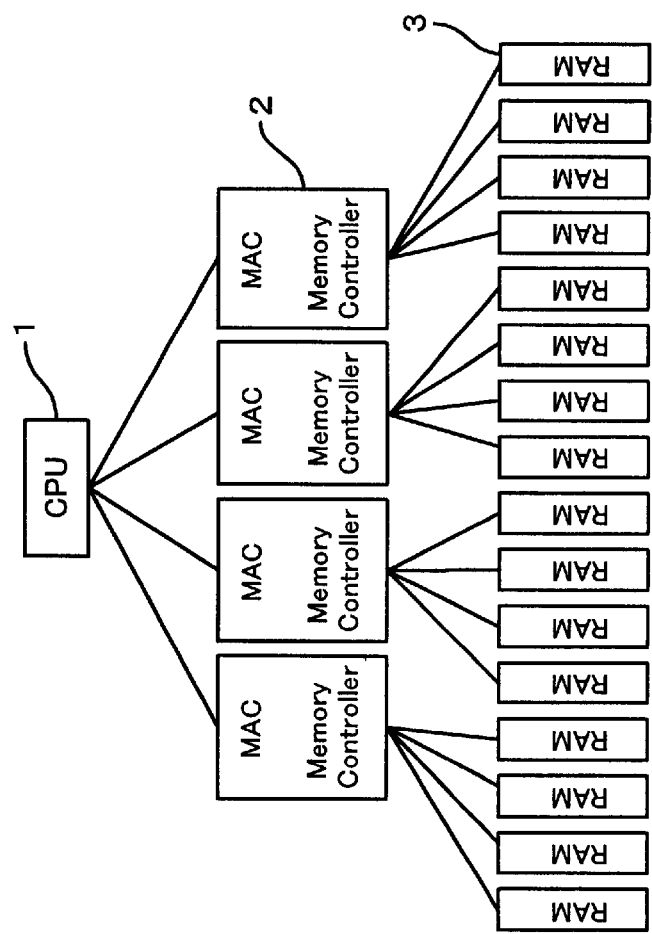

FIG. 1 are diagrams explaining a example of a computer system including a memory tested by a testing program of the present invention. In the computer system of FIG. 1A, a CPU 1 accesses a memory module 3 via a MAC controller 2 as a memory controller. The memory module 2 can control the predetermined number of memory modules 3, and in the case where the computer system has the greater number of memory modules than the predetermined number thereof, a plurality of the memory modules 3 are controlled by a plurality of the MAC controllers. In FIG. 1A, the computer system is integrated with 16 memory modules, and the four MAC controllers for controlling the four memory modules 3 are prepared, respectively.

FIG. 1B is a diagram showing an example of an address map of each of the memory modules 3. In FIG. 1B, the address of the memory module 3 is designated by a two-dimensional matrix designated by a column (CLM) address and a row (ROW) address. Furthermore, in the case where the address of the memory module 3 is configured by a plurality of two-dimensional matrixes, each of the two-dimensional matrixes is designated by a bank address. FIG. 1C is a data format example of an address designating signal from the CPU 1. The data format contains a row address, a column address, a bank, a MAC controller number (MAC NO.), and a memory module number (RAM NO.).

Figure 2:
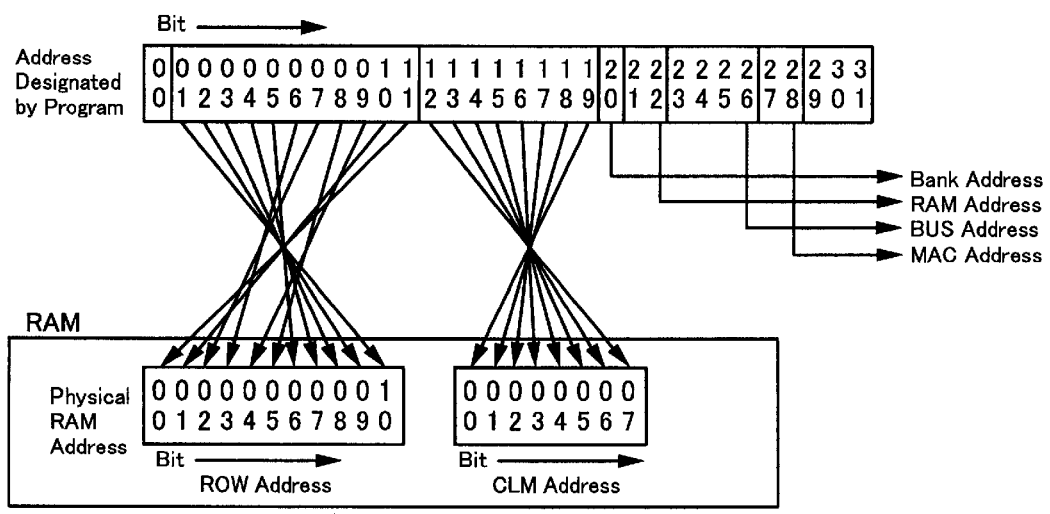
FIG. 2 is a diagram showing an example of a correspondence information between an address designating signal from a CPU 3 and a physical address in one memory module 1.

FIG. 2 is a diagram showing an example of the correspondence information between an address designating signal (an address designated by a program) from the CPU 1 and the physical address in the one memory module 3. As illustrated, a position of each bit of the row address and column address in the address designating signal does not agree with one of each bit of the row address and column address in the memory module 3. In this manner, the correspondence information between the address designated by the program and the physical address in the memory module 1 differs from each other according to a type of memory, or the number of versions even in a memory of the same type. Normally, a converting controller integrated in the memory module 3 executes a converting process between the designated address and the physical address in the memory module 3 in accordance with a converting rule given in advance.

On the other hand, in a memory test, it is necessary to continuously access the adjacent addresses in a memory. In general, because, in the case of accessing continuously the adjacent addresses (read and/or write), a probability of causing a memory error (read error and/or write error) is high.

Figure 3:
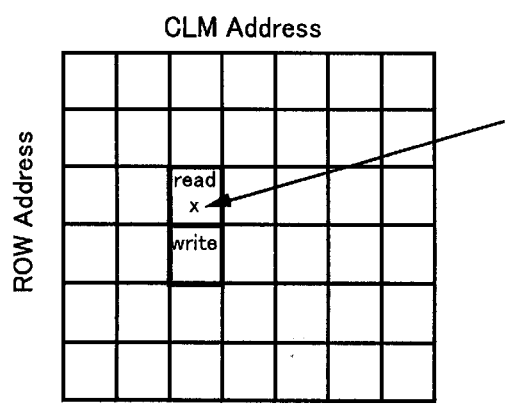
FIG. 3 is a typical diagram showing an example in the case where the adjacent addresses in a memory are specified.

FIG. 3 is a typical diagram showing an example in the case where the adjacent addresses are designated in the memory. As shown in FIG. 3, when the adjacent two addresses are designated, the error occurs in the read and/or write with respect to at least one address.

Accordingly, in the case where the testing program for executing a memory test is prepared, the adjacent addresses in the memory are continuously designated, it is necessary that presence or absence of the occurrence of the error is tested. However, as described above, as the correspondence information between the address designated by the program and the address of the memory is different according to a type of memory, etc., a programmer prepares the testing program of incorporating the addresses designated by the testing program which continuously accesses the adjacent addresses in the memory based on information of the correspondence information acquired from a memory manufacturer (hereinafter, referred to as address correspondence information).

The testing program prepared previously is applicable to only the memory of one type (or the same number of version of the same type), and is not applicable to another memory.

Then, according to the embodiment of the present invention, in order to prepare the versatile testing program, the address correspondence information can be input into the testing program from externally.

FIG. 4 are diagrams for explaining a memory testing method according to the embodiment of the present invention. In this embodiment, for clarity of the explanation, one-dimensional 4-bit addresses are considered, and the correspondence information between the address designated by the program (hereinafter, referred to as a program address) and the physical address in the memory (hereinafter, referred to as a physical address) is such correspondence information as in FIG. 4A.

In the memory testing method according to the embodiment of the present invention, correspondence information between the program address and the physical address is input from externally. An operator loads a testing program on a computer system storing a memory to be tested, and executes the testing program. Then, the testing program first demands an input of address correspondence information between a bit of the program address and a bit of the physical address.

The operator inputs the address correspondence information acquired in advance by use of input means such as a keyboard, etc. FIG. 4B is an example of the address correspondence information to be input. In FIG. 4B, as the address correspondence information, in accordance with FIG. 4A, correspondence information between a bit position P of the program address and a bit position R of the physical address is input.

When the address correspondence information is input, the testing program prepares an access list for the addresses in the memory. FIG. 4C is an example of the access list. The access list is correspondence information between all the program addresses and all the physical addresses. In FIG. 4C, a left-side address for each list number is a program address, and a right-side address therefor is a physical address. For example, in a list number 2, as the program address is "0001," a bit 03 of the program address is "1." At this time, according to the address correspondence information of FIG. 4A, the bit 03 of the program address corresponds to a bit 02 of the physical address. Therefore, the physical address is "0010,"

When the testing program prepares the access list, it executes a test of accessing continuously the adjacent addresses in the memory. Specifically, the testing program read-accesses a certain physical address A, and successively it write-accesses a physical access A+1 adjacent the physical address. This successive access is executed for all the physical address. For example, in the case where the testing program read-accesses the physical address "0000," it successively write-accesses an adjacent physical address "0001" ("0000"+"1"). For this access, the testing program designates the program address "0000" (list number 1), and successively "0010" (list number 3) in accordance with the access list. Similarly, in the case where the testing program read-accesses the physical address "0010," and write-accesses the adjacent physical address "0011," the testing program designates the program address "0001" (list number 2), and successively "0011" (list number 4).

Furthermore, as extension of the explanation, the addresses are designated by a two-dimensional matrix in the memory, and the case will be explained.

FIG. 5 are diagrams for explaining a memory test in the two-dimensional matrix according to the embodiment of the present invention. FIG. 5A shows an example of the correspondence information between the program address and physical address corresponding to the row address and column address in the two-dimensional matrix, respectively. FIG. 5B is a diagram showing typically the two-dimensional matrix of the memory.

Now, assume that the address to be tested is a physical address (3, 3) of FIG. 5B, namely (0011, 0011). The program address corresponding to this physical address is also (0011, 0011) from the correspondence information of FIG. 5A.

The access list of 8 addresses (addresses ① to ⑧ of FIG. 5B) adjacent this address to be tested is as in Table 1 mentioned below.

TABLE 1

| | physical address | program address |
|---|---|---|
| ① | (0010, 0010) | (0001, 0001) |
| ② | (0010, 0011) | (0001, 0011) |
| ③ | (0010, 0100) | (0001, 1000) |
| ④ | (0011, 0010) | (0011, 0001) |
| ⑤ | (0011, 0100) | (0011, 1000) |
| ⑥ | (0100, 0010) | (1000, 0001) |
| ⑦ | (0100, 0011) | (1000, 0011) |
| ⑧ | (0100, 0100) | (1000, 1000) |

The testing program selects in sequence the respective addresses ① to ⑧ adjacent to the physical address therein with respect to the address to be tested, and automatically executes the test of continuously accessing the two address adjacent to each other. Namely, the test is effected in combination of the address to be tested and the address ①, the address to be tested and the address ②, . . . , the address to be tested and the address ⑧. The testing program designates the program address for accessing the selected physical address in accordance with the access list.

By the way, as described above, in the case where the program address differs from the physical address, in some cases, data designated by the program (referred to as program data) separately differ from data (referred to as physical data) stored in the memory. A converting controller in the memory module 3 executes a converting processing between the program data and physical data in accordance with the converting rule imparted previously.

Figure 6:
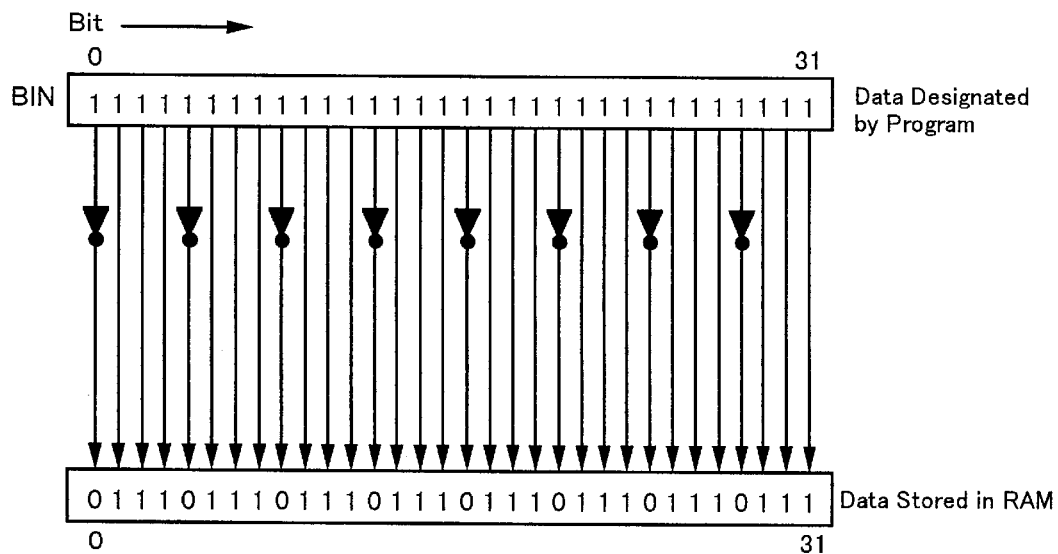
FIG. 6 is a diagram showing an example of correspondence information between program data and physical data.

FIG. 6 is a diagram showing an example of correspondence information between the program data and physical data. In FIG. 6, in the case where "1" is all designated as the program data, namely $$\text{"1111111111111111111111111111111"} \quad (1),$$

by an inverter action with respect to a predetermined bit shown in FIG. 6, $$\text{"01110111011101110111011101110111"} \quad (2)$$

is stored. Inversely, in the case where "1" is all stored as the physical data, the data (2) has only to be designated as the program data.

Accordingly, in the case where predetermined data are write-tested into the predetermined address, as the testing program has a process of receiving an input from outside of this data correspondence information, the data correspondence information can come to be versatilely utilized with respect to a plurality of different memories, respectively.

Figure 7:
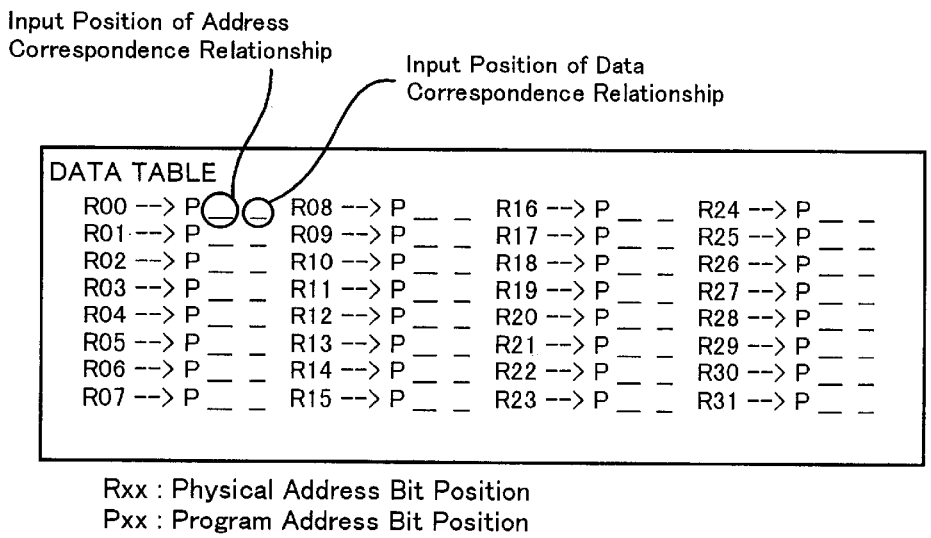
FIG. 7 is an input screen example of address correspondence information and data correspondence information.

FIG. 7 is an input screen example of address correspondence information and data correspondence information. In FIG. 7, the operator inputs a number of a bit position P of the program address in response to a bit position R of each physical address at an input position of the address correspondence information, and further in the case of bit-reversing by the data correspondence information, "1" is input to the adjacent input position of the data correspondence information, and in the case of not bit-reversing, "0" is input thereto.

The correspondence information between the program data and physical data is not limited to a relationship of inversion, and can be set based on various logic.

Next, the memory testing method according to another embodiment of the present invention will be explained. According to the another embodiment, the explanation is made in the system of the testing program's detecting the data format of an address designating signal and address correspondence information. As the computer system shown in FIG. 1A, it is assumed that each of the plurality of MAC controllers under control of the CPU 1 executes the memory test with respect to the computer system having a configuration which controls the predetermined number of memory module.

At this time, the data format of the address designating signal shown in FIG. 1C is indistinct, too. However, the number of bits (for example, 32 bits) of the data format is already known. The testing program first analyzes the data format by the following method:

In general, in the case where the CPU 1 accesses continuously a plurality of different addresses (physical addresses) of the memory module 3, the access speed differs according to a relationship between the plurality of addresses.

Figure 8A:
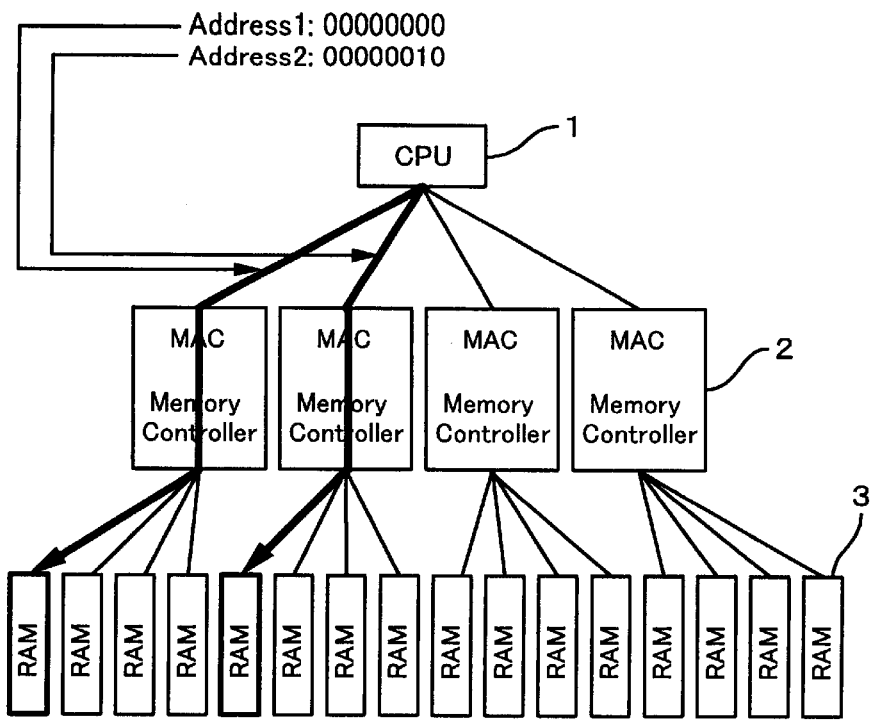
FIG. 8 are diagrams for explaining a difference in access speeds.
Figure 8B:
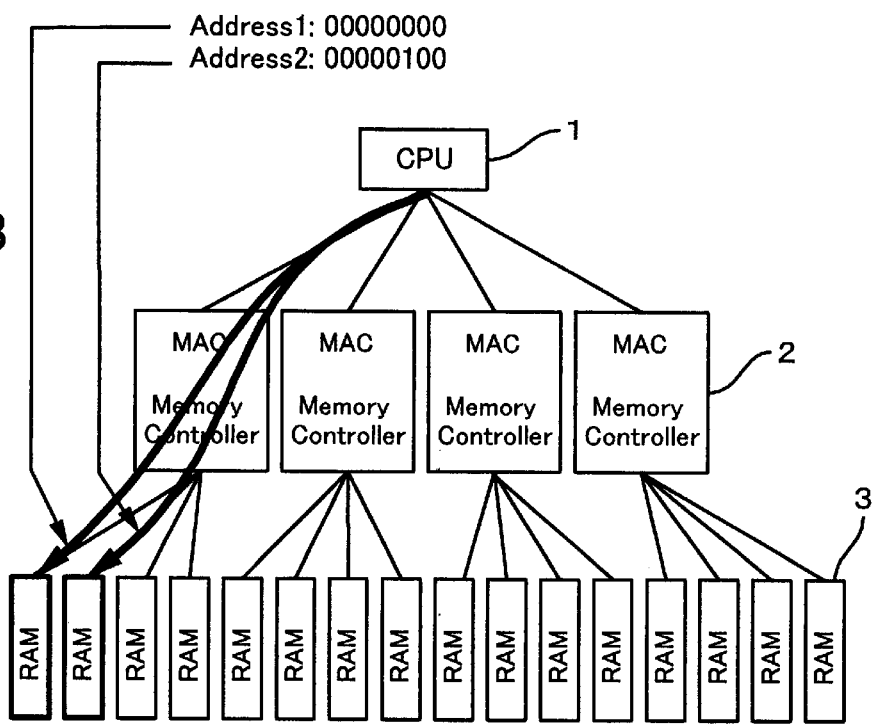

FIG. 8 are diagrams for explaining a difference of an access speed. FIG. 8A shows the case where a plurality of addresses (address 1 and address 2) exist in the separate memory modules 3 under control of the different MAC controllers 2, respectively. In this case, the address 1 and address 2 are accessed by way of the different MAC controllers 2. Accordingly, a parallel access control is enabled by each of the MAC controllers, and an access speed is increased. FIG. 8B shows the case where the plurality of addresses (address 1 and address 2) exist in the separate memory modules 3 under control of the one MAC controller 2, respectively. In this case, the address 1 and address 2 are accessed by way of the same MAC controller 2. Accordingly, since the access is controlled by the one MAC controller, the access speed is slower than the case of FIG. 8A.

In this manner, in the case of accessing a plurality of addresses, the access speed causes a difference according to whether each address belongs to the same MAC controller, or to the separate MAC controller. Furthermore, it is known that the access speed causes a difference according to an attribute of the access speed to the MAC controller of the plurality of addresses, as well as respective attributes thereof to the memory module, the bank in the memory module, the column address, and the row address. Namely, the access speed is different according to whether or not the plurality of addresses belong to the same memory module, are in the same bank in the memory module, are the same column address, or are the same row address. The difference in this access speed generally decreases in the order of the MAC controller, the memory module, the bank, the column address, and the row address.

Accordingly, a position of erecting a bit in the data format changes, while the access speed in the case of accessing the plurality of addresses is measured, thereby analyzing the data format.

Figure 9:
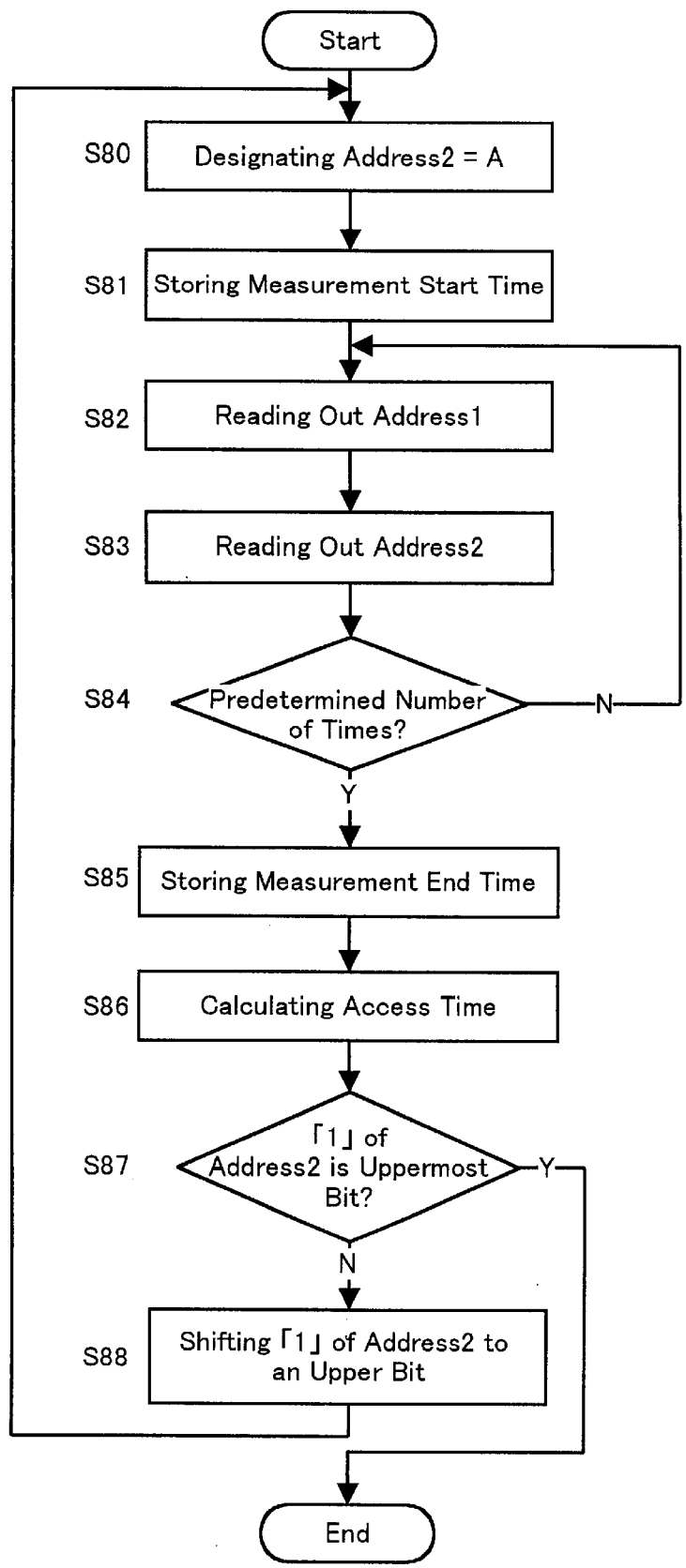
FIG. 9 is a flowchart of a testing program for analyzing a data format.

FIG. 9 is a flowchart of the testing program for analyzing the data format. For brevity of the explanation, the data format is 8 bits. The plurality of addresses are, for example, address 1=00000000 of all zeros, and address 2 erecting "1" at only 1 bit. The testing program accesses continuously the address 1 and address 2. A bit position erecting "1" of the address 2 is shifted, while continuous accesses of the address 1 and address 2 are executed. Initially, the continuous accesses of the address 1 and the address 2 erecting "1" at a lowest level bit are executed.

In FIG. 9, first the address 2=A is designated (S80). The first address 2 is 00000001. Next, a measurement start time is stored (S81). The time is measured by a system timer of the computer system. The address 1 is read out (S82). Successively, the address 2=A is read out (S83). S82 and S83 are repeated at the predetermined number of times (for example, about 100 times) (S84). Because a difference in the access speeds is increased to a comparable degree. When the readout at the predetermined number of times is ended, a measurement end time is stored (S85). From a difference between the measurement start time and measurement end time of step S85, the access time is calculated (S86).

A position of "1" of the address 2=A is shifted to an upper bit by 1 bit (S88), and steps S80 to S86 are repeated, and each access time is measured. Finally, the access time of the address 2=A erecting "1" at an uppermost bit of the address 2=A, namely 10000000, is measured (S87).

Table 2 illustrated below is an example of measuring results of the access time.

TABLE 2

| data format | access time (sec) |
|---|---|
| 00000000–00000001 | a (MAC controller) |
| 00000000–00000010 | b (memory module) |
| 00000000–00000100 | b (memory module) |
| 00000000–00001000 | c (bank) |
| 00000000–00010000 | d (column address) |
| 00000000–00100000 | d (column address) |
| 00000000–01000000 | e (row address) |
| 00000000–10000000 | e (row address) |

In Table 2, the access time is grouped into a plurality of steps (for example, a, b, c, d, e). Here, in the case where the access time is a<b<c<d<e, as the access time is small, the access speed is fast. Therefore, in Table 1, it can be judged that the bit position erecting "1" corresponds to an element shown in a parenthesis of Table 1. For example, a lowest level bit is a bit designating the MAC controller.

Furthermore, the number of times of access in a predetermined measuring time may be counted. As the number of times of accesses is large, the access speed is fast. Therefore, as described above, it is possible to judge the element corresponding to each bit from the number of times of accesses grouped.

In this manner, when the data format is analyzed, next, each address correspondence information of the row address and column address is searched. In the case where the address correspondence information of the row address is searched, the column address is fixed, and the row address is changed, and in the case where the address correspondence information of the column address is searched, the row address is fixed, and the column address is changed.

Figure 10A:
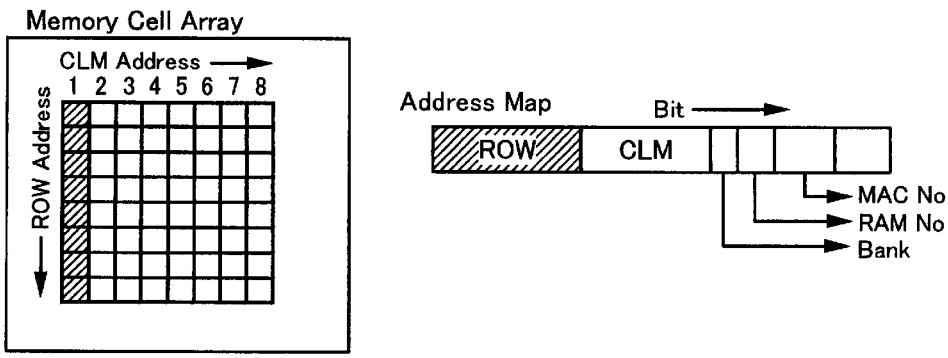
FIG. 10 are typical diagrams of a search of the address correspondence information between a row address and a column address.
Figure 10B:
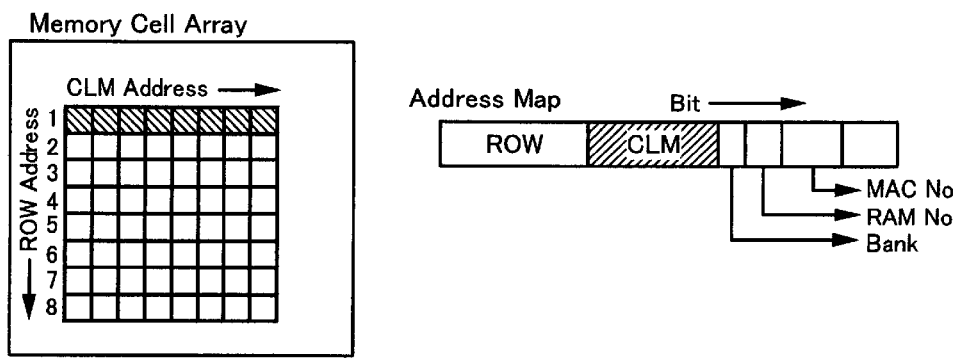

FIG. 10 are typical diagrams of a search of the address correspondence information of the row address and column address. FIG. 10A shows the case where the row address is changed. The column address is fixed to a certain column, and the row address is changed, and when the access in the column is ended, the column address is fixed to a next column, and the row address is changed. In this manner, all the addresses are accessed. On the other hand, FIG. 10B shows the case where the column address is changed. The row address is fixed to a certain row, the column address is changed, and when the access in the row is ended, the row address is fixed to a next row, and the column address is changed. In this manner, all the addresses are accessed.

Figure 11A:
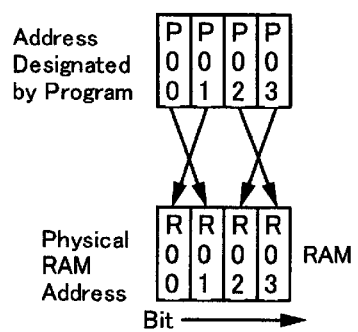
FIG. 11 are diagrams for explaining a method for searching the address correspondence information.
Figure 11B:
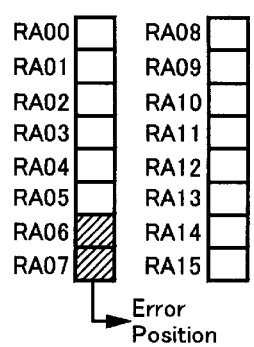

FIG. 11 are diagrams for explaining a system for searching the address correspondence information. For brevity of the explanation, the case where the address correspondence information of one-dimensional 4 bit is searched will be explained as an example. FIG. 11A is a diagram showing correct correspondence information between the program address and the physical address, and this correspondence information is searched. As shown in FIG. 11B, when the physical addresses RA06 ("0110") and RA07 ("0111") are continuously accessed, an error occurs in the physical address RA07.

The testing program generates the correspondence information between the program address and physical address at random. For example, the testing program generates the incorrect correspondence information as in FIG. 1C.

Figure 11C:
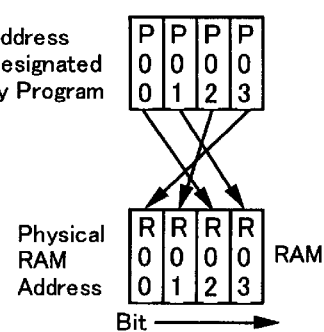

Table 3 is an access list of the correspondence information of FIG. 11C. Table 1 shows the correct physical address in accordance with the correspondence information of FIG. 11A for reference.

TABLE 3

|      | program address | physical address |   | correct physical address |
|------|-----------------|------------------|---|--------------------------|
| PA00 | 0000            | 0000(RA00)       | → | 0000(RA00)               |
| PA01 | 0001            | 1000(RA08)       | → | 0010(RA02)               |
| PA02 | 0010            | 0100(RA04)       | → | 0001(RA01)               |
| PA03 | 0011            | 1100(RA12)       | → | 0011(RA03)               |
| PA04 | 0100            | 0001(RA01)       | → | 1000(RA08)               |
| PA05 | 0101            | 1001(RA09)       | → | 1010(RA10)               |
| PA06 | 0110            | 0101(RA05)       | → | 1001(RA09)               |
| PA07 | 0111            | 1101(RA13)       | → | 1011(RA11)               |
| PA08 | 1000            | 0010(RA02)       | → | 0100(RA04)               |
| PA09 | 1001            | 1010(RA10)       | → | 0110(RA06)               |
| PA10 | 1010            | 0110(RA06)       | → | 0101(RA05)               |
| PA11 | 1011            | 1110(RA14)       | → | 0111(RA07)               |
| PA12 | 1100            | 0011(RA03)       | → | 1100(RA12)               |
| PA13 | 1101            | 1011(RA11)       | → | 1110(RA14)               |
| PA14 | 1110            | 0111(RA07)       | → | 1101(RA13)               |
| PA15 | 1111            | 1111(RA15)       | → | 1111(RA15)               |

According to Table 3, in accordance with the incorrect correspondence information of FIG. 1C, since the continuous access is made to the adjacent physical addresses RA06 and RA07, the program addresses PA10 ("1010") and PA14 ("1110") are continuously designated. However, in this designation of the program address, the access is actually made to the unadjacent physical addresses RA05 and RA13, and the error does not occur. Accordingly, it is possible to judge that the correspondence information of Table 2 is incorrect.

In this manner, in all combinations of the correspondence information, the test of accessing the adjacent physical addresses is effected, and the combinations of not causing the error are taken off, so that the address correspondence information can be narrowed down.

The method for searching the address correspondence information will be explained in more detail. FIGS. 12 and 13 are diagrams for explaining in detail the method for searching the address correspondence information. In FIG. 12, the testing program generates (selects) a combination of the address correspondence information at random from all combinations (FIG. 12A) of the correspondence information between the bit position (P) of the program address and the bit position (R) of the physical address (FIG. 12B). At this time, the correct address correspondence information is a relationship of FIG. 11A. Furthermore, in the case where, similarly to FIG. 11B, the continuous access is made to the adjacent physical addresses RA06 and RA07, the error occurs in the physical address RA07.

The testing program prepares the access list shown in FIG. 12C in accordance with the address correspondence information of FIG. 12B. FIG. 12C also shows the correct physical address corresponding to the program address for reference. In accordance with the access list of FIG. 12C, the testing program accesses continuously the adjacent physical address.

Since the testing program accesses continuously the physical addresses RA06 and RA07, it designates the program addresses PA09 and PA11. As the physical addresses RA06 and RA07 are correctly designated by the designation of this program address, the error occurs.

Accordingly, the testing program presumes that the correspondence information between Program address PA09–Physical address RA06        (3), and Program address PA11–Physical address RA07        (4), out of the access list of FIG. 12C is correct. The correspondence information of bit positions meeting the respective relationships of (3) and (4) is shown in FIGS. 12D and 12E, and the correspondence information meeting the both is shown in FIG. 12F. However, in FIG. 12F, the combinations of the bit positions of the program address and physical address are narrowed down. Namely, at least one combination of corresponding information is abstracted. But, in this case, the corresponding information is not specified to one combination.

The testing program further makes the second test in the same type of another memory. The testing program generates (selects) a combination of address correspondence information at random from the combinations meeting the correspondence information at the bit position of FIG. 13A (same with FIG. 12F), narrowed down in the first test (FIG. 13B). At this time, the correct address correspondence information is a relationship of FIG. 11A. Furthermore, in a present test, in the case where the continuous accesses are made to the adjacent physical addresses RA01 and RA02, the error occurs in the physical address RA02.

The testing program prepares the access list shown in FIG. 13C in accordance with the address correspondence information of FIG. 13B. In FIG. 13B, the correct physical address in response to the progress address is also shown for reference. In accordance with the access list of FIG. 13C, the testing program makes the continuous accesses to the adjacent physical address.

Since the testing program makes the continuous accesses to the physical addresses RA01 and RA02, the program addresses PA02 and PA01 are designated. As the physical addresses RA01 and RA02 are correctly designated by the designation of this program address, the error occurs.

Accordingly, the testing program presumes that the correspondence information between Program address PA02–Physical address RA01        (5), and Program address PA01–Physical address RA02        (6), out of the access list of FIG. 13C is correct. The address correspondence information meeting the respective relationships of (5) and (6) is shown in FIGS. 13D and 13E. The testing program searches the address correspondence information meeting both the address correspondence information, further the address correspondence information (FIG. 13A) which are narrowed down in the first test, and as shown in FIG. 13F, the address correspondence information in which the program address and physical address are specified to one combination is abstracted.

In the case where the corresponding address correspondence information is not acquired even in the second test, the testing program further tests another memory, and may repeat the aforesaid test until one combination of the address correspondence information is specified.

Furthermore, in the case where a plurality of errors occur in the one memory by the continuous accesses to a plurality of the physical addresses presumed that they are adjacent, similarly to the case where the aforesaid another memory is used, the combinations of the address correspondence information have only to be narrowed down in each error.

The memory in the present invention is a memory element such as a RAM, a ROM, or the like, and the type is not limited.

Hereinabove, according to the present invention, even in the case where the internal configuration is different in each memory (in the case where the correspondence information between the program address designated by the testing program and the physical address in the memory is different), the correspondence information of each memory is input from externally to the memory testing program, so that it becomes possible to use versatilely the memory testing program.

Furthermore, even in the case where the internal configuration is unclear, it becomes possible to presume the internal configuration, so that it becomes possible to use versatilely the memory testing program for various memories.

The scope of protection of the present invention is not limited to the above embodiments but covers the invention defined in the appended claims and its equivalents.

What is claimed is:

1. A memory testing method for detecting an error of a memory by executing a testing program accessing the memory, comprising the steps of:
   inputting correspondence information between each of a plurality of physical addresses in the memory and a program address designated by the testing program for accessing the respective physical addresses, from externally to the testing program; and
   designating the program address so as to access at least the one physical address of the memory in accordance with the correspondence information; wherein
   the program address is designated so as to continuously access the physical addresses adjacent to each other.

2. A memory testing method for detecting an error of a memory by executing a testing program accessing the memory to write data therein, comprising the steps of:
   inputting correspondence information between first data of at least 1 bit to be written into the memory and second data of at least 1 bit to be designated by the testing program for writing the first data into the memory, from externally to the testing program; and
   designating the second data so as to write the first data into the memory in accordance with the correspondence information.

3. A memory testing method for detecting an error of a memory by executing a testing program accessing the memory, comprising the steps of:
   measuring an access speed to the memory or a value corresponding thereto by a plurality of program addresses which are designated by the testing program for accessing the physical addresses of the memory and have a plurality of bit values different from each other; and
   acquiring a data format of the program address based on the access speed or the value corresponding thereto.

4. A memory testing method according to claim 3, wherein
   the data format of the program address includes a bit corresponding to each identifier of a row address and column address constituting the physical address of the memory, a bank, each memory of a plurality of memories and each memory controller for controlling the plurality of memories of a plurality of memory controllers.

5. A memory testing method for detecting an error of a memory by executing a testing program accessing the memory, comprising the steps of:
   selecting arbitrary one of all combinations of correspondence information between each of the plurality of physical addresses in the memory and a program address designated by the testing program for accessing each of the physical addresses;
   continuously accessing the plurality of physical addresses based on the selected combination of correspondence information; and
   in the case where a first error is detected in the step of accessing, abstracting at least one combination in which the plurality of physical addresses detected the first error are adjacent to each other from the all combinations of the correspondence information.

6. A memory testing method according to claim 5, further comprising the steps of:
   in the case of a plurality of the abstracted combinations of the correspondence information, selecting further arbitrary one from the abstracted combinations of the correspondence information;
   continuously accessing the plurality of physical addresses based on the selected combination of correspondence information; and
   in the case where a second error is detected in the step of accessing, further abstracting at least one combination in which the plurality of physical addresses detected the second error are adjacent to each other from the abstracted combinations of the correspondence information.

7. A recording medium storing a testing program for a memory to detect an error of the memory, the testing program comprising the operations of:
   accepting an input of correspondence information between each of a plurality of physical addresses in the memory and a program address designated by the testing program for accessing the respective physical addresses; and
   designating the program address so as to access at least one physical address of the memory in accordance with the correspondence information; wherein
   the program address is designated so as to continuously access the physical addresses adjacent to each other.

8. A recording medium storing a testing program for a memory to detect an error of the memory, the testing program comprising the operations of:
   accepting an input of correspondence information between first data of at least 1 bit to be written into the memory and second data of at least 1 bit to be designated by the testing program for writing the first data into the memory, from externally to the testing program; and
   designating the second data so as to write the first data into the memory in accordance with the correspondence information.

9. A recording medium storing a testing program for a memory to detect an error of the memory, the testing program comprising the operations of:
   measuring an access speed to the memory or a value corresponding thereto by a plurality of program addresses which are specified by the testing program for accessing the physical addresses of the memory and have a plurality of bit values different from each other; and acquiring a data format of the program address based on the access speed or the value corresponding thereto.

10. The recording medium according to claim 9, wherein the data format of the program address includes a bit corresponding to each identifier of a row address and column address constituting the physical address of the memory, a bank, each memory of a plurality of memories and each memory controller for controlling the plurality of memories of a plurality of memory controllers.

11. A recording medium storing a testing program for a memory to detect an error of the memory, the testing program comprising the operations of:

selecting arbitrary one of all combinations of correspondence information between each of the plurality of physical addresses in the memory and a program address designated by the testing program for accessing each of the physical addresses;

continuously accessing the plurality of physical addresses based on the selected correspondence information; and in the case where a first error is detected in the step of accessing, abstracting at least one combination in which the plurality of physical addresses detected the first error are adjacent to each other from the all combinations of the correspondence information.

12. The recording medium according to claim 11, further comprising the operations of:

in the case of a plurality of the abstracted combinations of the correspondence information, selecting further arbitrary one from the abstracted combinations of the correspondence information;

continuously accessing the plurality of physical addresses based on the selected combination of correspondence information; and in the case where a second error is detected in the step of accessing, further abstracting at least one combination in which the plurality of physical addresses detected the second error are adjacent to each other from the abstracted combinations of the correspondence information.

* * * * *